(12) United States Patent
Wang et al.

(10) Patent No.: US 8,294,169 B2
(45) Date of Patent: Oct. 23, 2012

(54) LIGHT-EMITTING DIODE

(75) Inventors: Wenbing Wang, Taipei (TW);
Ming-Wei Chan, Taipei (TW)

(73) Assignees: Maintek Computer (Suzhou) Co., Ltd.,
Suzhou, Jiangsu (CN); **Pegatron
Corporation**, Beitou District, Taipei
(TW)

( * ) Notice: Subject to any disclaimer, the term of this
patent is extended or adjusted under 35
U.S.C. 154(b) by 65 days.

(21) Appl. No.: 12/855,717

(22) Filed: Aug. 13, 2010

(65) Prior Publication Data

US 2011/0062483 A1 Mar. 17, 2011

(30) Foreign Application Priority Data

Sep. 15, 2009 (TW) .............................. 98131129 A

(51) Int. Cl.
*H01L 31/00* (2006.01)
(52) U.S. Cl. .............................. 257/98; 257/99; 257/100
(58) Field of Classification Search .................... 257/98,
257/99, 100; 359/604
See application file for complete search history.

(56) References Cited

U.S. PATENT DOCUMENTS

| 6,084,252 | A | 7/2000 | Isokawa | |
|---|---|---|---|---|
| 6,521,916 | B2 | 2/2003 | Roberts | |
| 6,679,608 | B2 * | 1/2004 | Bechtel et al. | 359/604 |
| 7,365,371 | B2 * | 4/2008 | Andrews | 257/99 |

FOREIGN PATENT DOCUMENTS

| CN | 2720644 Y | 8/2005 |
|---|---|---|
| CN | 1789363 A | 6/2006 |
| CN | 101311238 A | 11/2008 |
| CN | 101510582 A | 8/2009 |
| JP | S6318534 A | 1/1988 |
| JP | H01145192 A | 6/1989 |
| JP | H05129660 A | 5/1993 |
| JP | H1067039 A | 3/1998 |
| JP | 2002176203 A | 6/2002 |
| JP | 2005108936 A | 4/2005 |
| JP | 2005303046 A | 10/2005 |
| JP | 2006241230 A | 9/2006 |
| JP | 2006324436 A | 11/2006 |
| JP | 20072017 A | 1/2007 |
| JP | 2008103393 A | 5/2008 |
| JP | 2008262767 A | 10/2008 |
| JP | 200988294 A | 4/2009 |

\* cited by examiner

*Primary Examiner* — Long Pham
*Assistant Examiner* — Steven Rao
(74) *Attorney, Agent, or Firm* — Winston Hsu; Scott Margo

(57) ABSTRACT

This invention provides a light-emitting diode (LED). The LED is electrically connected with a circuit board. The LED includes a light-emitting chip, an encapsulating element, a lead, and a heat insulating element. The encapsulating element encapsulates the light-emitting chip. The lead is coupled with the light-emitting chip and the circuit board. The lead and the encapsulating element form a first connecting place. The lead and the circuit board form a second connecting place. The heat insulating element is disposed between the first connecting place and the second connecting place.

6 Claims, 1 Drawing Sheet

LIGHT-EMITTING DIODE

CROSS-REFERENCE TO RELATED APPLICATIONS

This Non-provisional application claims priority under 35 U.S.C. §119(a) on Patent Application No(s). 098131129 filed in Taiwan, Republic of China Sept. 15, 2009, the entire contents of which are hereby incorporated by reference.

BACKGROUND OF THE INVENTION

1. Field of the Invention

This invention relates to a light-emitting diode (LED) and, more particularly, to an LED capable of preventing a breakdown.

2. Description of the Related Art

A light-emitting diode (LED) is a kind of light-emitting devices capable of directly converting electrical energy to visible light and radiation energy. Since the LED has a series of properties, such as low working voltage, low power consumption, high light-emitting efficiency, small volume and so on, the LED has become a popular product in daily life.

In the LED industrial chain, LED substrates and LED chips are produced in the upstream, the LED chips are designed and manufactured in the midstream, and the LED are encapsulated and tested in the downstream. With popularization of the LED, unprecedented attention is paid to the upstream and midstream industry of the LED, which further advances industrial development of encapsulation technology in the downstream.

The LED encapsulation technology mainly includes lead-type encapsulation and surface mount encapsulation. During the LED lead-type encapsulation, lead frames are used as leads with various kinds of encapsulation appearance. The above encapsulation structure is successfully developed and put on the market at the earliest. There are a great variety of the encapsulation structures, and the technology is in high maturation. The lead-type encapsulation is regarded as the most convenient and economical solution in the current LED encapsulation technology by most customers.

In the lead-type encapsulation, the lead of the LED is combined with a circuit board by wave soldering. When the LED is wave soldered at a high temperature of 270° C., a part of heat is transferred to an encapsulating element via the lead, causing that the temperature at the connecting place of the encapsulating element and the lead reaches 155° C. Since the encapsulating element is mainly made of epoxy, and the upper limit of a heat resisting range thereof is 130+10° C., at that moment, the temperature of the encapsulating element has already been beyond the heat resisting range thereof, causing that properties of the encapsulating element change and the encapsulating element thermally expands, thereby generating great internal stress exceeding bearing pull force of an internal gold wire of the LED. Thus, the gold wire is broken, causing the LED to be broken down.

BRIEF SUMMARY OF THE INVENTION

One objective of this invention is to provide a light-emitting diode (LED) to improve the prior art.

An LED in the invention is electrically connected with a circuit board. The LED includes a light-emitting chip, an encapsulating element, a lead, and a heat insulating element. The encapsulating element encapsulates the light-emitting chip. The lead is coupled with the light-emitting chip and the circuit board. The lead and the encapsulating element form a first connecting place. The lead and the circuit board form a second connecting place. The heat insulating element is disposed between the first connecting place and the second connecting place.

Via the heat insulating element in the invention, the temperature of the encapsulating element is allowed to be lowered to be within a heat resisting range thereof. As original properties of the encapsulating element do not change and temperature of wave soldering is not reduced, an encapsulation process can be satisfied, preventing a breakdown of the LED during the encapsulation process.

These and other features, aspects, and advantages of the present invention will become better understood with regard to the following description, appended claims, and accompanying drawings.

DETAILED DESCRIPTION OF THE INVENTION

Figure 1:
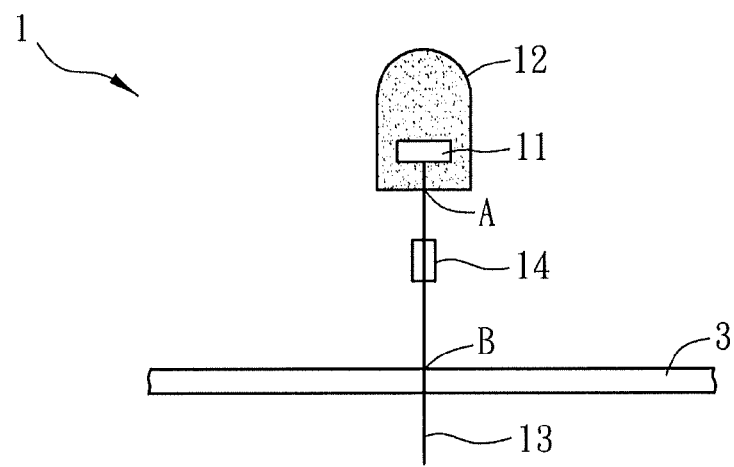
FIG. 1 is a schematic diagram showing a light-emitting diode (LED) according to a first preferred embodiment of the invention.

FIG. 1 is a schematic diagram showing a light-emitting diode (LED) according to a first preferred embodiment of the invention. An LED 1 in the embodiment is electrically connected with a circuit board 3. The LED 1 includes a light-emitting chip 11, an encapsulating element 12, a lead 13, and a heat insulating element 14. The number of the lead 13 and the heat insulating element 14 is not limited in the invention. The number of the heat insulating element 14 can correspond to that of the lead 13.

In the embodiment, the encapsulating element 12 encapsulates the light-emitting chip 11. The lead 13 is coupled with the light-emitting chip 11 and the circuit board 3. The lead 13 and the encapsulating element 12 form a first connecting place A. The lead 13 and the circuit board 3 form a second connecting place B. The heat insulating element 14 is disposed at any position between the first connecting place A and the second connecting place B. The position does not include the first connecting place A and the second connecting place B.

In the embodiment, the encapsulating element 12 is mainly made of epoxy. According to mechanical properties of the epoxy, the epoxy as an amorphous macromolecule material has three states: a glassy state, a rubbery state, and a viscous flow state. Glass transition refers to the transformation of the amorphous macromolecule material between the rubbery state and the glassy state. The transition temperature corresponding to the glass transition is called glass transition temperature (Tg).

When the macromolecule in the glassy state is transformed at Tg, the modulus thereof reduces three orders of magnitude, allowing the material to be suddenly transformed from a hard solid to a soft rubber, which totally changes the usage functions of the material. A plurality of physical properties, such as volume (specific volume), thermodynamic properties (specific thermal capacity, enthalpy), and electromagnetic properties (dielectric constants, dielectric losses, width of nuclear magnetic resonance spectrum and so on), of the macromolecule obviously change.

To maintain the properties of the epoxy, the upper limit of heat resisting range of the encapsulating element is Tg+10° C. When temperature is beyond the upper limit of the heat resisting range, the epoxy thermally expands owing to the rapid change of the thermal capacity, thermal expansion coefficients and so on, such that great internal stress is generated to cause an internal gold wire (not shown) to be broken.

In the embodiment, when the LED 1 is in a lead-type encapsulation process, the lead 13 is first inserted into the circuit board 3 by passing through a through hole (not shown) of the circuit board 3. Then, the lead 13 is combined with the circuit board 3 by wave soldering.

In the embodiment, when the LED 1 is wave soldered, a part of heat is transferred upwards from the second connecting place B via the lead 13. When the heat is transferred to the heat insulating element 14, the heat is blocked by the heat insulating element 14, such that the less heat can be transferred to the first connecting place A. Thus, the temperature at the first connecting place A is lower than the upper limit of the heat resisting range of the epoxy.

In the embodiment, the heat insulating element 14 is made of a red adhesive or an ultraviolet (UV) curable adhesive. However, the invention is not limited thereto. The heat insulating element can be made of any material with a heat insulating function. The red adhesive mainly includes epoxy, hardener, dye, and fillers. The UV curable adhesive mainly includes oligomers, monomers, photoinitiators, and various kinds of auxiliaries.

In the embodiment, the position of the heat insulating element 14 does not include the first connecting place A and the second connecting place B. If the heat insulating element 14 is disposed at the first connecting place A, the temperature at the first connecting place A cannot be effectively ensured to be within the heat resisting range of the epoxy. If the heat insulating element 14 is disposed at the second connecting place B, the through hole of the circuit board 3 may fail to contact tin well in soldering, such that the combination of the lead 13 and the circuit board 3 is not firm.

Figure 2:
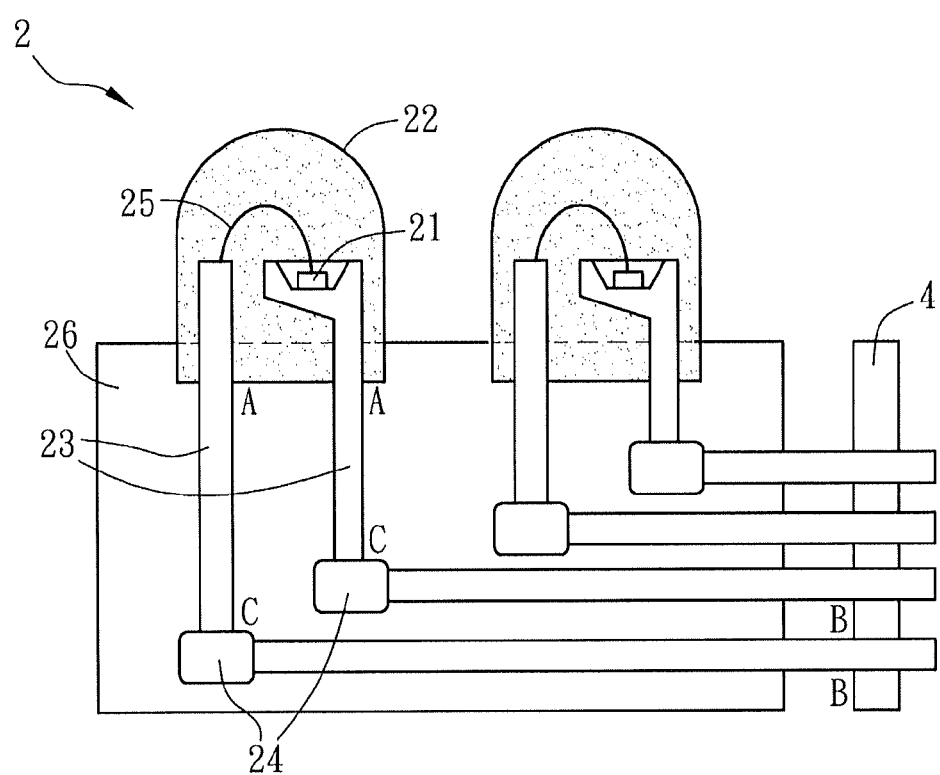
FIG. 2 is a schematic diagram showing an LED according to a second preferred embodiment of the invention.

FIG. 2 is a schematic diagram showing an LED according to a second preferred embodiment of the invention. An LED 2 in the embodiment is electrically connected with a circuit board 4. The LED 2 includes a light-emitting chip 21, an encapsulating element 22, a lead 23, a heat insulating element 24, a gold wire 25, and a covering element 26. In the embodiment, the respective number of the leads 23 and the heat insulating elements 24 is two. However, the invention is not limited thereto. The number of the gold wire 25 and the covering element 26 is also not limited in the invention.

In the embodiment, the light-emitting chip 21, the encapsulating element 22, and the heat insulating elements 24 are the same as those described in the first embodiment. Therefore, they are not described herein for a concise purpose. Only the difference is described hereinbelow.

In the embodiment, the leads 23 are L-shaped lead frames for supporting the light-emitting chip 21 and being coupled with the light-emitting chip 21 and the circuit board 4. The leads 23 have a bending place C, respectively. To facilitate disposition, the heat insulating elements 24 in the embodiment can be disposed at the bending places C. However, the invention is not limited thereto.

In the embodiment, the gold wire 25 is coupled with the light-emitting chip 21 and the leads 23. The covering element 26 covers a portion of the leads 23. The covering element 26 is used for protecting the leads 23 and fixing the encapsulating element 22. At the same time, the covering element 26 beautifies the appearance.

In the embodiment, the temperature at a first connecting place in the state that the leads 23 of the LED 2 are exposed is compared with that in the state that the leads 23 are covered by the heat insulating element 24 in soldering to describe advantages of the invention.

In the first state (the leads 23 of the LED 2 are exposed in soldering), an LED 2 is taken for experiment. First, the covering element 26 is removed from the LED 2. At the same time, a temperature sensing wire is soldered at the first connecting place A. Next, the LED 2 and the circuit board 4 pass through wave soldering at 270° C. for five seconds. Then, the temperature at the first connecting place A is sensed by the temperature sensing wire.

The temperature of the wave soldering in the experiment is 270° C. However, the invention is not limited thereto. Skilled persons in the art can apply the LED 2 in the embodiment to any high temperature process.

The Tg of the encapsulating element 22 of the LED 2 in the experiment is 130° C. That is, the upper limit of the heat resisting range of the encapsulating element 22 is 140° C. However, the invention is not limited thereto.

The heat insulating elements 24 used in the experiment are red adhesives. However, the invention is not limited thereto. Any material, such as a UV curable adhesive, with a heat insulating function can be used as the heat insulating elements.

The result of the experiment shows that when the leads 23 are exposed in the solder wave, the temperature at the first connecting place A sensed by the temperature sensing wire is 155° C.

Correspondingly, after the heat insulating elements 24 are disposed at the bending places C of the leads 23, the temperature at the first connecting place A sensed by the temperature sensing wire is 131° C.

Obviously, after the heat insulating elements 24 are disposed at the bending places C of the leads 23, the temperature at the first connecting place A is reduced from 155° C. to 131° C. That is, the temperature at the first connecting place A is reduced from the value higher than the upper limit of the heat resisting range to the value lower than the upper limit of the heat resisting range. Thus, The LED can be efficiently prevented from being broken down caused by break of the gold wire owing to the high temperature during the encapsulation process.

To sum up, via the heat insulating element, the LED in the embodiment allows the temperature of the encapsulating element to be within a heat resisting range thereof. As the original properties of the epoxy and the gold wire do not change and the temperature of the wave soldering is not reduced, the encapsulation process can be satisfied, thereby preventing a breakdown of the LED during the encapsulation processing.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A light-emitting diode (LED) electrically connected with a circuit board, the LED comprising:
   a light-emitting chip;
   an encapsulating element encapsulating the light-emitting chip, wherein the circuit board is disposed outside of the encapsulating element;
   a lead coupled with the light-emitting chip and the circuit board, the lead and the encapsulating element forming a first connecting place, the lead and the circuit board forming a second connecting place; and a heat insulating element disposed outside of the encapsulating element and disposed between the first connecting place and the second connecting place.

2. The LED according to claim 1, wherein the lead is L-shaped.

3. The LED according to claim 2, wherein the heat insulating element is disposed at a bending place of the L-shaped lead.

4. The LED according to claim 1, wherein the LED further comprises a gold wire and a covering element, the gold wire is coupled with the light-emitting chip and the lead, and the covering element covers a portion of the lead.

5. The LED according to claim 1, wherein the heat insulating element is made of a red adhesive or an ultraviolet curable adhesive.

6. The LED according to claim 1, wherein the encapsulating element is made of epoxy and a glass transition temperature of the encapsulating element is 130 degrees Celsius.

* * * * *